US010608612B2

(12) United States Patent
Kauschke (10) Patent No.: US 10,608,612 B2
(45) Date of Patent: Mar. 31, 2020

(54) SAW FILTER COMPRISING AN ADDITIONAL POLE (71) Applicant: SNAPTRACK, INC., San Diego, CA (US)

(72) Inventor: Thomas Kauschke, München (DE)

(73) Assignee: SnapTrack, Inc., San Diego, CA (US)

( * ) Notice: Subject to any disclaimer, the term of this patent is extended or adjusted under 35 U.S.C. 154(b) by 32 days.

(21) Appl. No.: 15/762,995

(22) PCT Filed: Aug. 3, 2016

(86) PCT No.: PCT/EP2016/068578
§ 371 (c)(1),
(2) Date: Mar. 23, 2018

(87) PCT Pub. No.: WO2017/050474
PCT Pub. Date: Mar. 30, 2017

(65) Prior Publication Data
US 2018/0302060 A1 Oct. 18, 2018

(30) Foreign Application Priority Data
Sep. 25, 2015 (DE) .................. 10 2015 116 224

(51) Int. Cl.
H03H 9/60 (2006.01)
H03H 9/64 (2006.01)
(52) U.S. Cl.
CPC .......... H03H 9/605 (2013.01); H03H 9/6409 (2013.01); H03H 9/6483 (2013.01)

(58) Field of Classification Search
CPC ..... H03H 9/605; H03H 9/6409; H03H 9/6483
USPC .......... 333/133, 187, 188, 193–196
See application file for complete search history.

(56) References Cited

U.S. PATENT DOCUMENTS

| 2007/0052494 | A1 | 3/2007 | Shibagaki et al. | |
| 2008/0238572 | A1* | 10/2008 | Funami | H03H 9/725 333/133 |
| 2010/0148887 | A1 | 6/2010 | Matsuda et al. | |
| 2010/0194496 | A1 | 8/2010 | Goto et al. | |
| 2014/0210569 | A1* | 7/2014 | Tasaka | H03H 7/463 333/133 |

FOREIGN PATENT DOCUMENTS

EP 1976117 A2 10/2008

OTHER PUBLICATIONS

International Search Report and Written Opinion—PCT/EP2016/068578—ISA/EPO—dated Nov. 2, 2016.

* cited by examiner

Primary Examiner — Robert J Pascal
Assistant Examiner — Jorge L Salazar, Jr.
(74) Attorney, Agent, or Firm — Patterson & Sheridan, LLP (57) ABSTRACT In order to suppress an interference frequency in a ladder-type filter, an additional resonator (RZ1) that acts as a capacitance is connected in parallel to a series resonator (S1). The antiresonance of the additional resonator creates an additional pole in order for the interference frequency to be attenuated more effectively.

11 Claims, 6 Drawing Sheets

(PRIOR ART)

Fig. 9

(PRIOR ART)

Fig. 10

(PRIOR ART)

SAW FILTER COMPRISING AN ADDITIONAL POLE

CROSS-REFERENCE TO RELATED APPLICATIONS

This application is a national stage application under 35 U.S.C. 371 of PCT/EP2016/068578, filed Aug. 3, 2016, which claims the benefit of German Patent Application Serial No. 102015116224.5, filed on Sep. 25, 2015, both of which are incorporated herein by reference in their entirety.

BACKGROUND

In order to reduce the temperature response of SAW filters, they are provided with a compensation layer—typically comprising SiO2. A side effect of this measure, however, is that the coupling is reduced. Broadband filters having such compensation layers can therefore be realized only on highly-coupled substrates.

Bandpass filters made of SAW resonators having a compensation layer can, for example, be made on lithium niobate crystals having a red-128 cut angle. The resonance frequency of the acoustic Rayleigh mode is used on this substrate material.

In many filters with certain material combinations for electrodes and layers deposited thereon, and/or for certain layer thickness combinations, however, a parasitic SH mode (shear horizontal mode) is capable of propagation on lithium niobate. The resonance frequency of the SH mode is above the resonance frequency of the Rayleigh mode. For the serial resonators of a filter, the SH resonances are in the range of the upper passband edge of the filter and cause drops in the transmission function. Even if the geometry of this filter is optimized for maximum suppression of the SH mode, it can be enhanced as a result of tolerance-related geometric deviations and under temperature and power loads. This can cause an increased temperature and power load on the resonators that could result in premature wear and, ultimately, failures of the filter.

Furthermore, today's front-end modules must serve more and more frequency bands, so that the mutual isolation of the various filters is an ever-greater task. In particular, the Tx filters must be designed so that they have sufficient attenuation in parallel Rx bands.

SUMMARY

The aim of the present invention is to specify a SAW filter with which the attenuation at a disturbance frequency of a bandpass filter constructed from SAW resonators can be improved in a simple manner. A further aim is to safely and permanently avoid an interfering SH mode in the frequency range of the upper passband edge.

This aim is achieved by a SAW filter. Further embodiments of the invention and a method for shifting an interfering SH mode in a SAW filter can be found in further claims.

A SAW filter according to the invention is constructed from SAW resonators and has a ladder-type structure. This comprises a series branch, connected between the filter inlet and outlet, in which series resonators are arranged. Branching off from the series branch, parallel branches are provided, which connect the series branch to a fixed potential and, in particular, to ground. For example, one filter has between two and five parallel branches, and just as many series resonators. However, the number of series resonators can also differ from the number of parallel resonators. Further, a filter may have a higher number of resonators if a higher selection is desired.

According to the invention, a filter designed as an additional resonator is connected in parallel to one of the series resonators in the filter constructed, in a known manner so far. The pitch of this additional resonator is dimensioned to be capacitive at the center frequency of the filter, but forms with its anti-resonance at an interfering frequency an additional pole for improved attenuation of the interference frequency.

This makes it possible to improve the suppression in the Rx range of another frequency band in a Tx filter and to improve a parallel operation in both bands. This can improve the properties of front-end modules that can handle both bands.

According to one embodiment, the pitch of the additional resonator is lowered relative to the pitch of the series resonator, to achieve improved attenuation at a given interference frequency above the passband. However, it is also possible to increase the pitch of the additional resonator with respect to the pitch of the series resonator in order to achieve an improved attenuation at a given interference frequency below the passband.

The anti-resonance frequency of the additional resonator can be set to an interference frequency to be suppressed outside the passband of the filter. The resonance frequency of this resonator can be set to almost any frequency, as long as it is sufficiently far away from the passband of the filter. Then, the resonator acts as pure capacitance at frequencies in the passband of the filter. Through the anti-resonance frequency of the additional resonator, a pole is generated, which can be used to dampen interference particularly well when the pole is adjacent to the passband. However, even more distant interference frequencies, such as higher frequency resonances of plate modes or bulk waves, can be suppressed well through appropriately set resonant frequencies of the first capacitance.

With the additional resonator and further measures, it is also possible to move an interfering SH mode out of the interfering region of the upper passband edge—as already mentioned in the case of certain material combinations and filter configurations.

For this purpose, the series resonator, which has the lowest anti-resonance frequency of all series resonators in the filter, is provided with the largest finger period. The pole zero gap of this series resonator is reduced compared to the other series resonators. The reduction in the pole zero gap is so dimensioned that the parasitic shear mode (SH mode) of this first series resonator disappears from the passband of the filter, due to the smaller finger period and the smaller pole zero gap, or occurs only at a frequency above the passband edge.

To reduce the pole zero gap, the additional resonator may be connected in parallel with this first series resonator. The capacitance of this additional resonator is dimensioned such that the parasitic shear mode (SH mode) of this first series resonator disappears from the passband of the filter, due to the smaller finger period and the smaller pole zero gap, or occurs only at a frequency above the passband edge.

In other words, in the case of the first series resonator, which has the lowest resonance and anti-resonance frequency by design, the pole zero gap is reduced by the parallel connection of the additional resonator and the first series resonator. Since the anti-resonance for the passband also shifts to an unfavorably lower frequency, this is compensated for by an opposite shift in the frequency, which is achieved by reducing the finger period of the first series resonator. The compensation can take place in such a way that the anti-resonance frequency returns to its original position before the reduction in the pole zero gap. In order not to increase the total capacitance of the parallel-connected resonator over the original value of the resonator, the resonator is correspondingly made smaller by reducing the number of apertures or decreasing the number of fingers.

As a result, a filter is obtained in which the interfering resonance to be assigned to the shear mode has completely disappeared from the passband and comes to rest above the passband edge. Bandwidth and insertion loss of the filter remain practically unchanged, so that, despite deviation from a design known and already optimized with respect to the filter properties and, in particular, with respect to the passband, still no deterioration of the filter property in the passband is to be accepted.

This additional effect of the SH mode shift in the filter according to the invention can be realized by simple means without much effort. Compared with a conventional ladder-type filter, a filter with an additional resonator requires only an insignificantly higher area on the filter substrate, since, at the same time, the capacitance of the resonator is to be reduced, in order to keep the total capacitance of the parallel connection of capacitance and resonator in the required range.

Another way to reduce the pole zero gap is to select appropriate substrate materials or to change the design accordingly. For example, a change in the layer structure with respect to materials and layer thickness is possible—in particular, by the application and/or modification of a trim layer. An SiO2 layer applied as a compensation layer for the reduction of the TCF may be—e.g., locally—supplemented with an additional layer or merely changed in thickness, to reduce the coupling to the desired extent, reducing the pole zero gap.

A filter according to the invention with shifted SH mode is more powerful than a filter with an interfering SH mode in the region of the passband or the passband edge. The invention has no significant influence on the passband characteristic, and therefore exclusively delivers an improved performance.

A filter according to the invention can be used in duplexers and passband filters in order to better dampen an interfering frequency and/or to move an interfering SH mode out of the range of the passband. In the Tx filter, interference frequencies can be in the Rx range of other bands, so that these frequencies are better suppressed in the inventive (Tx) filter and no longer interfere with the operation in the other frequency band.

A filter according to the invention is preferably used as a TX filter, which is subjected to a higher power in the transmission mode than an Rx filter during reception, and in which, therefore, an interfering mode has a much more negative effect than with an RX filter.

As already mentioned, the invention can be used, in particular, for bandpass filters which use Rayleigh waves, are constructed on lithium niobate, and have a compensation layer that reduces the coupling (TCF compensation).

Advantageously, they are also used in resonators having copper-based electrodes. Such an electrode structure may comprise, for example, partial layers of chromium, silver, copper and chromium. An alternative electrode structure comprises, for example, layers of titanium, silver, copper and titanium.

According to one embodiment, the filter is constructed on lithium niobate substrate with a cutting angle between red-125 and red-130. This cutting angle range has a high coupling constant for Rayleigh waves.

As a preferred piezoelectric substrate for the filter, lithium niobate crystals having a red-128 cutting angle can be selected.

According to a further embodiment, the SAW filter according to the invention has, above the electrode metallization on the substrate, an SiO2 layer as TCF compensation layer. This layer may have a relative layer thickness in the range of 15 to 50%, relative to the wavelength of the acoustic useful wave.

Above the compensation layer, a silicon nitride layer may be applied, to shield against moisture.

In one embodiment, the SAW filter is designed for operation in a broadband frequency band with a relative bandwidth >3%—in particular, for operation in the bands 2 or 3.

A filter according to the invention can also have several first series resonators whose resonant frequencies, in the absence of measures according to the invention, cause an SH interference mode in the region of the passband or in the region of the passband edge.

Accordingly, in such SAW filters according to the invention, respective first capacitances are connected in parallel to all the first series resonators with a correspondingly low anti-resonance frequency. At the same time, these first series resonators are provided with a shorter finger period, compared with the other series resonators. It is important that there always be further series resonators left which have an unchanged pole zero gap, to ensure the necessary bandwidth of the filter.

A like method according to the invention can be used to generate an additional filter pole. In a first step, the filter is designed in a conventional manner on the basis of SAW one-port resonators. For the design, only the achievement of a desired passband characteristic is considered.

Such a filter is constructed in a known manner from a series branch, connected between the filter inlet and outlet, in which series resonators are arranged, and n parallel branches connected in parallel to the series branch against a fixed potential, in each of which a parallel resonator is arranged. In that regard, a conventional ladder-type structure is designed.

Parallel to a first series resonator, an additional resonator is provided and connected.

In the next step, the pitch of the additional resonator is adjusted so that its anti-resonance frequency forms an additional pole at an interference frequency to be suppressed, in order to improve the attenuation of the filter at the interference frequency.

To shift the SH mode, the one or several first series resonators is/are determined which, in this first design, have an interfering SH mode in the region of the passband or passband edge. This can be done by a simulation method that takes into account the occurrence of SH modes.

The first series resonators are, then, the series resonators determined in this way with their SH mode with respect to their interfering frequency position. Parallel to the first series resonators, in each case, a first capacitance formed as an interdigital structure is connected, which reduces the pole zero gap of the first series resonator(s).

In the next step of the design, the antiresonance frequency shifted by the smaller pole zero gap is shifted back to the intended position in the region of the right passband edge, by correspondingly reducing the finger period of these first series resonators. The amount of the frequency shift in the resonance frequency caused by the reduced finger period preferably corresponds exactly to the amount by which the pole zero gap is shortened. Thus, the anti-resonance frequency of the first series resonators again comes to lie at the frequency that the first series resonators, without parallel capacitance and without finger period reduction, would have had, which corresponds to the optimal frequency position determined in the first step.

In the next step, the capacitance of the resonator is reduced by reducing the aperture or by reducing the number of fingers, so that the total capacitance of resonator and parallel capacitance corresponds again to the original capacitance of the resonator.

In the method according to the invention, the said frequencies of the first series resonators are shifted so far that the frequency of the SH mode dependent upon the resonant frequency of these resonators is shifted towards a frequency above the passband edge.

According to one embodiment of the invention, a frequency value Δf, by which the SH mode is at least to be shifted upwards until it no longer interferes with the passband, is first determined. By exactly this value Δf, the pole zero gap is then reduced, which is set by selecting an appropriate capacitance value of the first parallel capacitance.

In a specific application example, the filter is designed for TX frequencies in mobile band 2, which by definition are 1,850 MHz to 1,910 MHz. Above the passband in the range from 2,110 MHz to 2,155 MHz, the RX frequencies of the mobile radio band 4 are also arranged. According to this embodiment, the capacitance parallel to the first series resonator is now embodied as a resonator, and its frequency position is set so that a pole is formed in the transfer function of the filter at the RX frequencies of band 4. An interference in the RX band of the adjacent band 4 is thereby avoided. In this way, in addition to the shift of the SH mode, it is additionally possible to improve the attenuation of the filter at an interference frequency.

The invention is explained in more detail below with reference to embodiments and the associated figures. The figures are purely schematic, and partly designed as a block diagram. In the figures, only the important elements of the invention are shown, to which reference is made as well. This means that, in addition, still further elements not shown may be present in a filter according to the invention.

BRIEF DESCRIPTION OF DRAWINGS

FIG. 2 a circuit symbol and metallization of the resonators used according to the invention, FIG. 3 a detail of a filter according to the invention, in schematic cross-section, FIG. 4 the transmission curve determined by simulation for the filter shown in FIG. 1, FIG. 5 the impedance of a first resonator before and after variation according to the invention, FIG. 6 the impedances of the resonators used for a filter according to the invention, together with the resulting transmission curve, FIG. 7 the transmission curves determined by simulation for the filter shown in FIG. 6, FIG. 8 a filter known from the prior art, FIG. 9 the impedances of the resonators used for filters of FIG. 8, together with the resulting transmission curve, FIG. 10 the simulated passband of the filter according to FIGS. 8 and 9, with and without consideration of SH modes.

DETAILED DESCRIPTION

Figure 1:
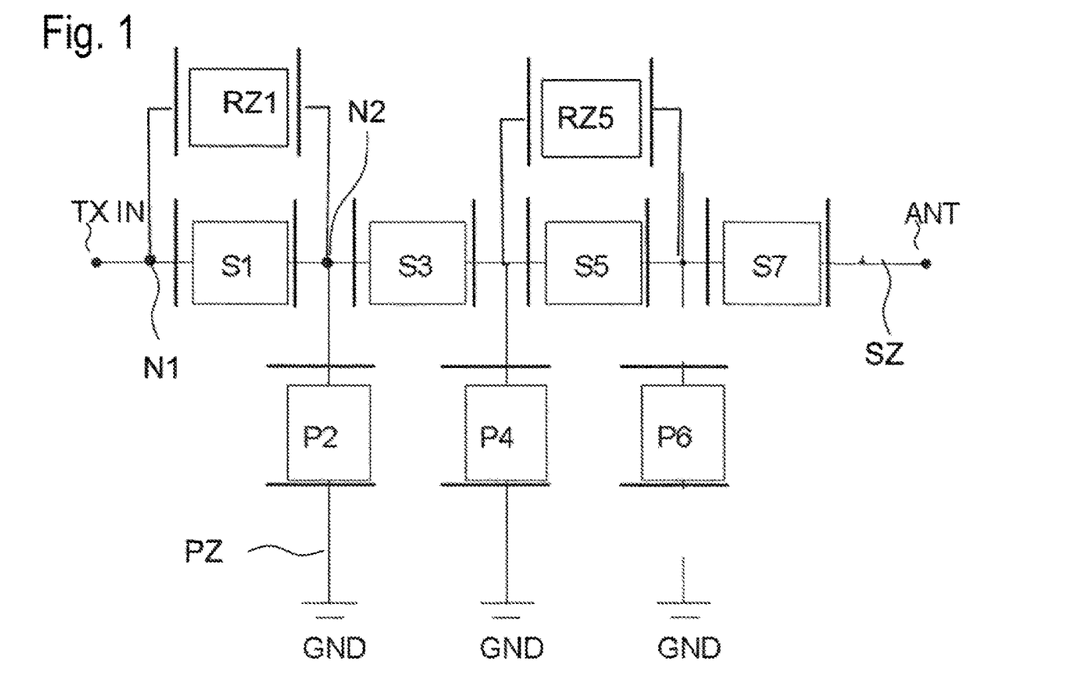
FIG. 1 a first SAW filter according to the invention.

FIG. 1 shows a first exemplary embodiment according to the invention on the basis of a schematic block diagram. The filter consists of a series branch SZ, which is connected between two terminals TXIN and ANT. In series branch SZ, four series resonators S1, S3, S5, and S7 are arranged. Between each two series resonators, a parallel branch PZ branches off to ground GND from the series branch, in each of which a parallel resonator P2, P4, or P6 is arranged. Parallel to at least one of the series resonators—in this case, the two series resonators S1 and S5—an additional resonator RZ1, RZ5 is connected in each case. The additional resonator RZ1 connects a first circuit node N1 in the series branch in front of the series resonator S1 to a second circuit node N2 arranged in the series branch after the series resonator S1. The same applies to the additional resonator RZ2. All series and parallel resonators S, P are listed as SAW resonators.

Figure 2:
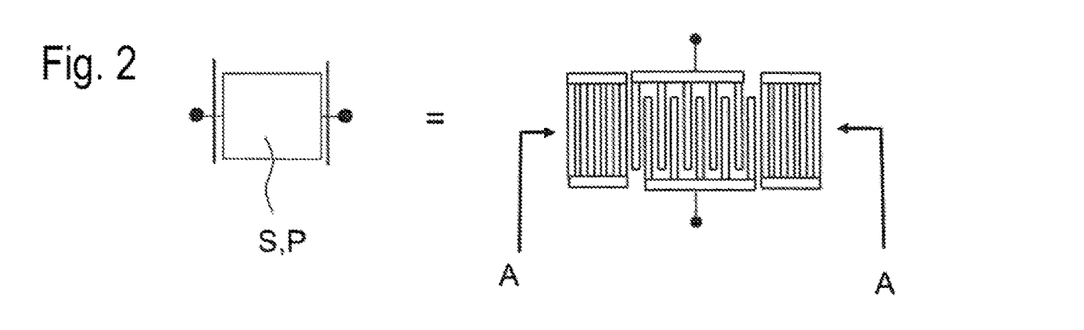

FIG. 2 shows, in the left part, the circuit symbol used for the resonators, while, in the right part, schematically, an exemplary metallization of a resonator usable for the invention is provided. Copper-based, multilayer systems are preferably used as metallizations—for example, a layer sequence of chromium Cr, silver Ag, copper Cu and chromium Cr, or a layer sequence of titanium Ti, silver Ag, copper Cu and titanium Ti. However, other layer systems for the electrodes are possible, but preferably have at least one copper layer.

The metallization is deposited on a piezoelectric substrate with high coupling—in particular, on a lithium niobate crystal with a red-128 crystal cut.

Figure 3:
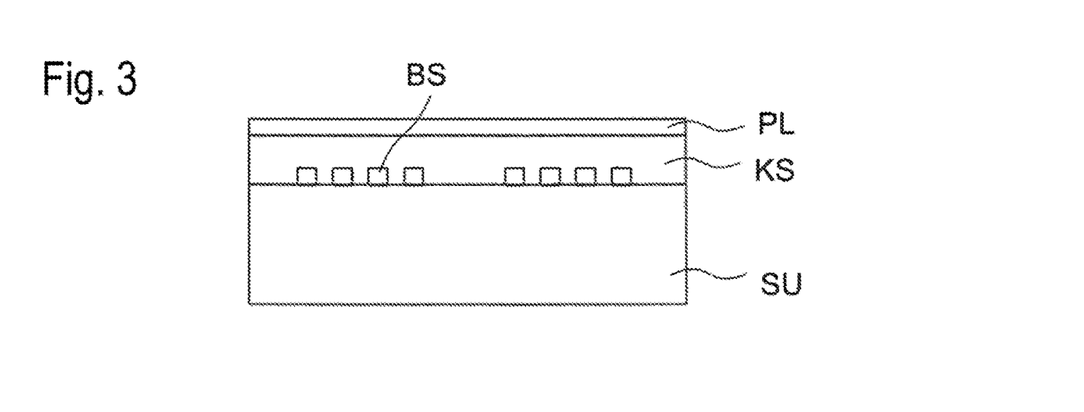

FIG. 3 shows a cross-section through a SAW filter, as it may be formed according to the invention. On the piezoelectric substrate SU, the component structures of the filter—in particular, the electrode fingers and/or the fingers of the associated reflectors—are shown in the cross-sectional view transverse to the finger extension. Directly above the substrate SU coated with the component structures BS, a compensation layer KS is applied, by means of which the temperature coefficient of the frequency is reduced or even compensated for. For this purpose, usually, a SiO2 layer of sufficient thickness is used.

In order to protect the moisture-sensitive compensation layer KS against environmental influences, a protective layer PL is applied as a final uppermost layer, e.g., a thin silicon nitride layer having a thickness of 10 nm to 200 nm.

Figure 4:
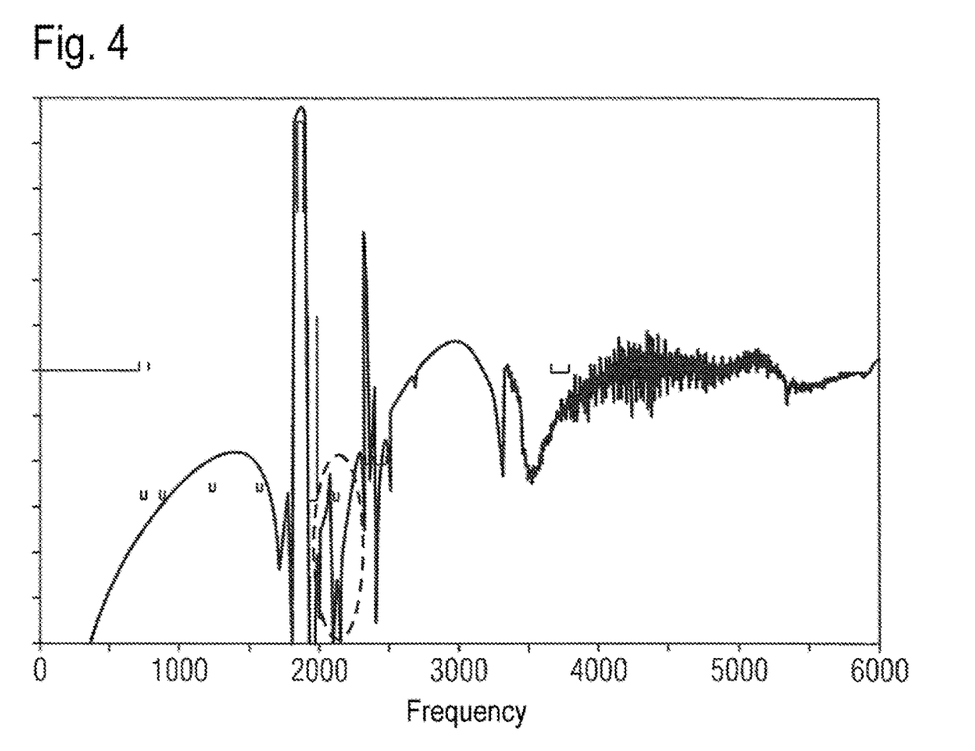

FIG. 4 shows the simulated transmission curve of the filter shown in FIG. 1. Compared to a known filter without additional resonators, the attenuation in the region of an interference frequency is improved. The improvement is circled in the figure. As an application example, a band 2 Tx filter is selected, which shows a clear pole, and thus the improved damping, in the Rx region of a band 4 duplexer.

For a further explanation of the invention—in particular, for explaining the method according to the invention for shifting an interfering SH mode—the design method of a filter according to the invention will be described in the following in extracts, and the measures required for this purpose will be explained.

Figure 8:
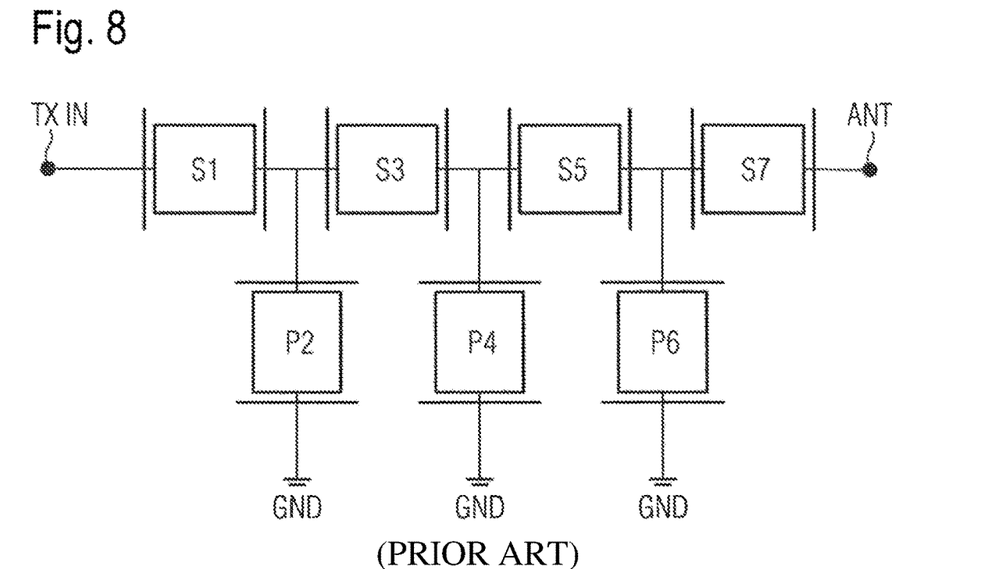

FIG. 8 shows a conventional SAW filter with the same basic structure as the SAW filter according to the invention shown in FIG. 1, in which only the additional resonators are missing. The frequencies of the series and parallel resonators S, P are chosen so that there is a desired passband. In that regard, the filter is optimized for the desired band.

Figure 9:
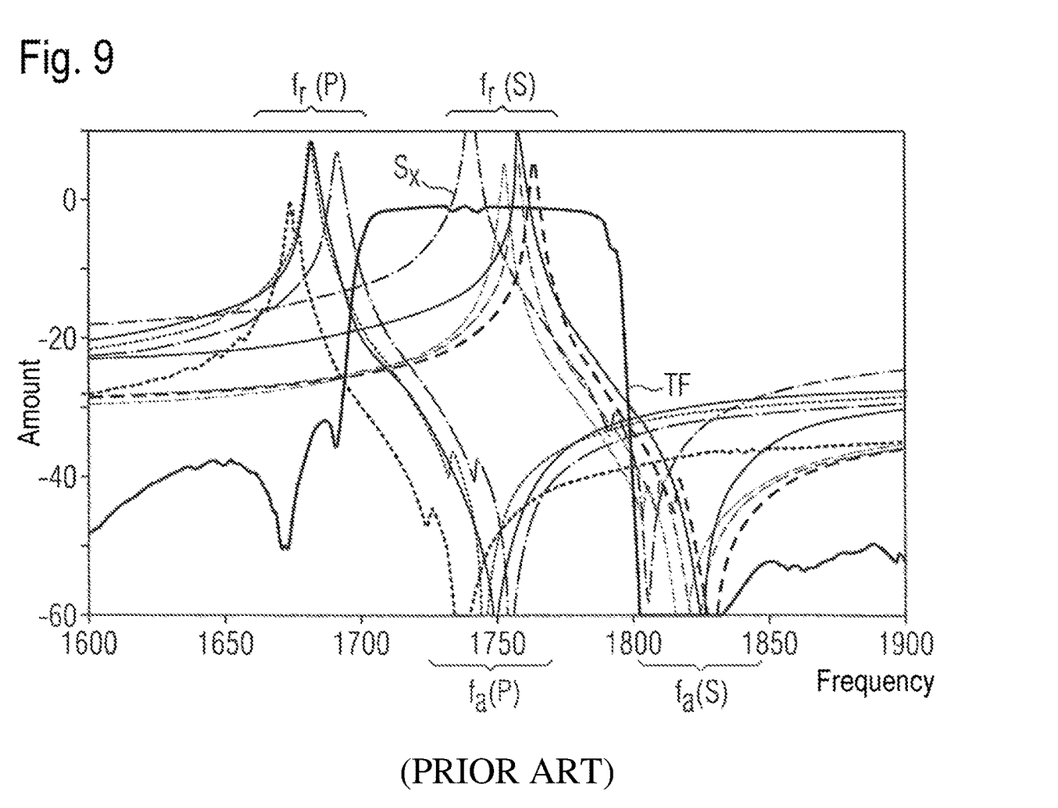

FIG. 9 shows the various resonators used for the known filter according to FIG. 8, with their impedances and the resulting transmission curve TF or transfer function.

In order to realize the filter with the illustrated high bandwidth, the resonance frequencies fr(P) and fr(S) of the series resonators S and the parallel resonators P are offset from each other and, preferably, all selected so as to differ. In the region fr(P), the resonance frequencies of the parallel resonators occur, recognizable at the minimum of their impedance curves. At a constant pole zero gap, the anti-resonances of the parallel resonators can be found at a corresponding distance thereto in the range fa(P).

In a same or similar frequency range fr(S), the resonant frequencies of the series resonators are found, which are preferably arranged symmetrically to the center of the passband.

The anti-resonance frequencies of the series resonators are found in the frequency range fa(S) above the right passband edge of the transfer function TF.

All curves shown in FIG. 9 are the result of a simulation that was determined without taking account of interfering shear wave modes (SH modes) that occur.

Figure 10:
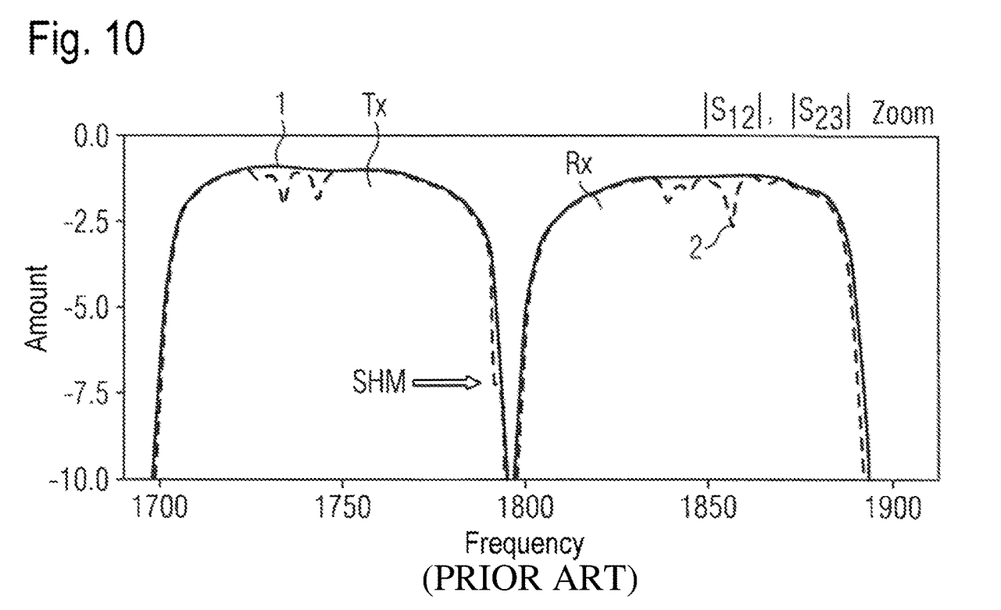

FIG. 10: If, however, the occurrence of SH modes is allowed in the simulation calculation, the transmission behavior shown in FIG. 10 is obtained for the filter structure, shown in FIGS. 8 and 9, in the passband. Two passbands for the TX filter (left curves) and the RX filter (right curves) of a duplexer are shown. For better recognition of the effect of an interfering SH mode SHM, two curves are superimposed in the figure, corresponding to the simulation without consideration of the SH modes according to curve 1 and, once, taking into account SH modes occurring that correspond to curve 2. In the TX filter, an interfering resonance appears at the point marked with an arrow in the right passband edge, corresponding to the interfering SH mode SHM. However, such an SH mode in the region of the passband edge leads to a greater thermal load on the filter, which leads to an additional power load on the filter and, correspondingly, to a higher thermal load, which accelerates the aging of the filter and may damage the component structures BS.

The calculation also shows that the interfering SH mode is generated by the series resonator with the lowest resonance frequency. The distance between SH mode and resonance frequency is only in the range of the passband edge when the resonance frequency of the use mode (Rayleigh wave) is arranged at a correspondingly low frequency, since the frequency distance of the SH mode to the Rayleigh mode in the resonators of the filter is almost constant. The impedance of this first resonator is designated by RSx in FIG. 9.

The interfering SH-mode can be minimized by suitably matching the layer thicknesses of electrodes, compensation layer, and protective layer and by a suitable choice of the metallization ratio of the electrodes in their height. However, since the exact tuning has a tolerance due to production-related deviations, it cannot be effectively suppressed in a series production, or the proportion of filters with no or poorly suppressed SH mode is too high.

A simple shifting of the resonant frequency of the series resonator with the interfering SH mode towards higher frequencies, and thus also a shifting of the interfering peak of the SH mode from the range of the passband edge, is not possible without adversely affecting the passband characteristic or the right passband edge. According to the invention, therefore, the pole zero gap of this resonator with the interfering SH mode is reduced by a frequency value $\Delta f$ by connecting one or more additional resonators in parallel to this series resonator; see, for example, the resonators RZ1 and RZ2 in FIG. 1.

Due to the capacitance of the additional resonator—capacitive only at the center frequency of the filter—the anti-resonance frequency of the series resonator is shifted by the value $\Delta f$ toward lower frequencies, and thus reduces the pole zero gap. However, in order to compensate for this effect and bring the anti-resonant frequency back to the right position important for the formation of the passband edge, the finger period is shortened in parallel, to move the resonance frequency by the value $\Delta f$ to higher frequencies. This may also be necessary in all cases in which an additional pole is primarily intended to be generated by the additional resonator, so as to better suppress an interference frequency.

Figure 5:
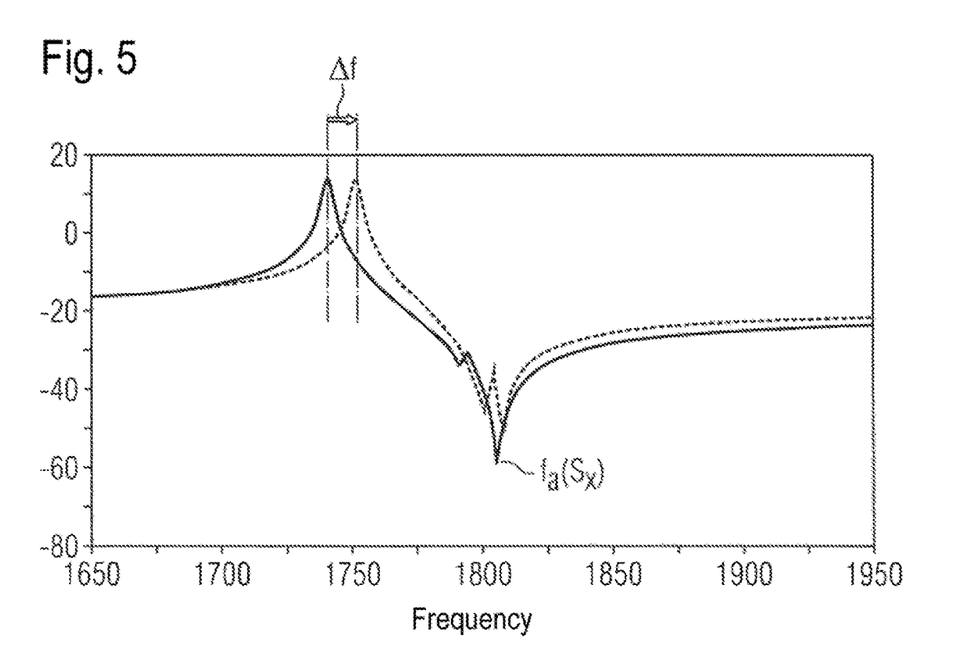

FIG. 5 shows a simulation calculation of the impedance of the first series resonator, without an additional resonator (left curve), and with a parallel-connected resonator and extended finger period (right-hand curve). By virtue of the two measures, the position of the anti-resonance frequency remains practically unchanged according to the minimum of the two curves, while the resonance frequency shifts by the value $\Delta f$ towards higher frequencies.

Figure 6:
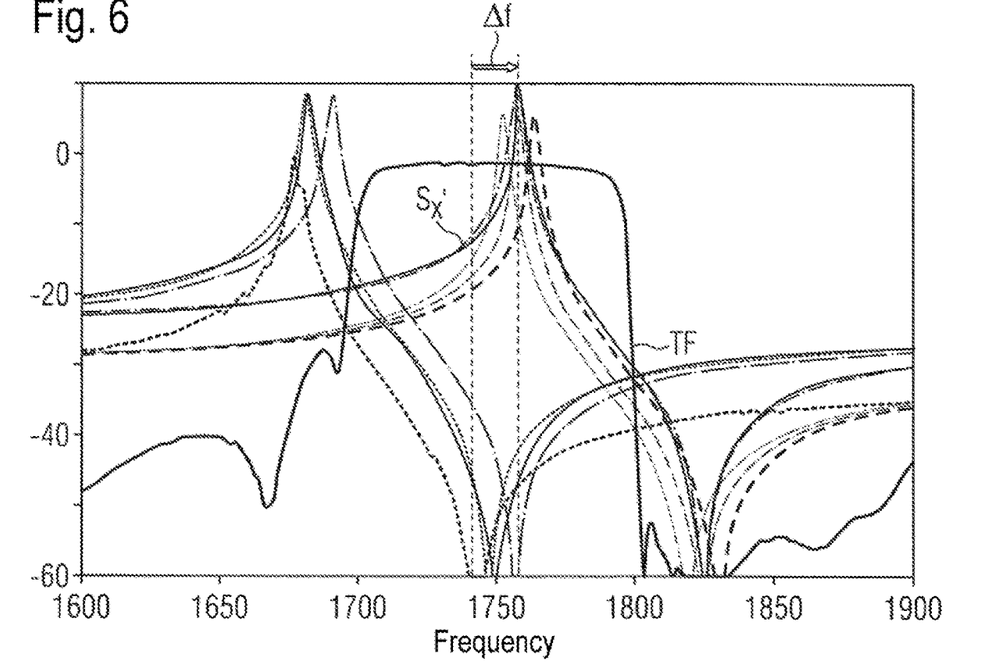

FIG. 6 shows a representation corresponding to FIG. 9, but in which, now, the impedance of the series resonator, with the additional resonator connected in parallel in position and pole zero gap, is changed. The resonance frequency is now shifted upwards by a value $\Delta f$, while the position of the anti-resonance remains unchanged. It turns out that the passband TF remains almost unchanged, despite the additional resonator.

Figure 7:
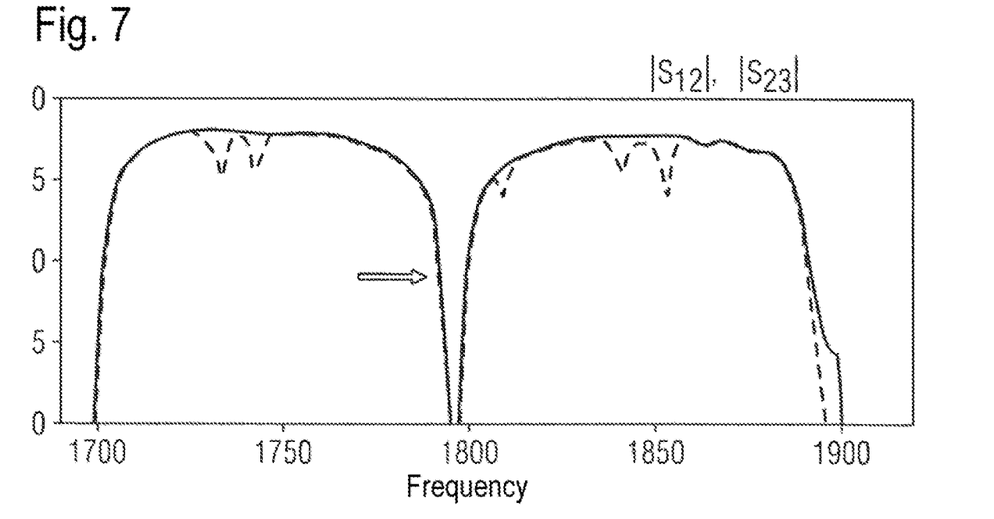

FIG. 7 shows the passband of the corresponding filter in a simulation, with and without consideration of SH modes. The two curves are again shown above one another, corresponding to FIG. 10 already described. Compared to FIG. 10, FIG. 7 shows the effect produced by the invention that, in the region of the right-hand passband edge (see arrow), the SH mode (see SHM in FIG. 10) completely disappears in both calculations or in both curves, or no longer occurs. The remaining passband characteristics remain virtually unchanged, so that, with the measure according to the invention, no disadvantages in the range of the passband are to be accepted.

In further embodiments, not shown, further series resonators can be connected in parallel with additional resonators beyond that shown in FIG. 1. In order to not reduce the bandwidth of the filter, only the frequency resonant series resonators, whose SH modes are within the passband or its edge, are connected in parallel with capacitances. Furthermore, the number of parallel branches and the number of series resonators can be further increased.

In a further embodiment, not shown, individual, several, or all of the resonators are implemented as cascaded. Cascading here means that the individual SAW resonator as shown in FIG. 2 is replaced by a series connection of at least two partial resonators. Cascading lowers the voltage applied to the resonator, so that the area of the resonator is to be increased accordingly to compensate for this. At the same time, the power stability of the component structures is thereby increased, so that, in particular, those resonators are cascaded that are exposed to the strongest signal amplitudes. These are—particularly in the case of a TX filter—the series resonators arranged close to the input (TXin) and the parallel resonators with the highest resonance frequency. Also not shown are inductances, with which, in particular, the parallel branches can be connected in series with fixed potential.

Figure 11:
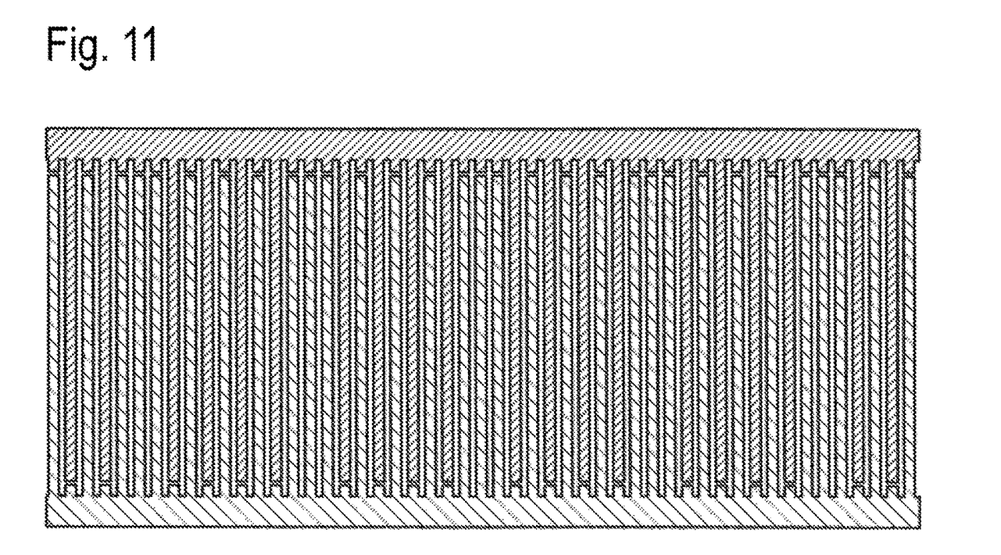
FIG. 11 a plan view of an alternative usable series resonator, with removal weighting, FIG. 12 the relative space requirements of alternative solutions for reducing the pole zero gap.

FIG. 11 shows a plan view of a resonator, with removal weighting. This is another alternative to using parallel capacitances for reducing the pole zero gap of a resonator.

Figure 12:
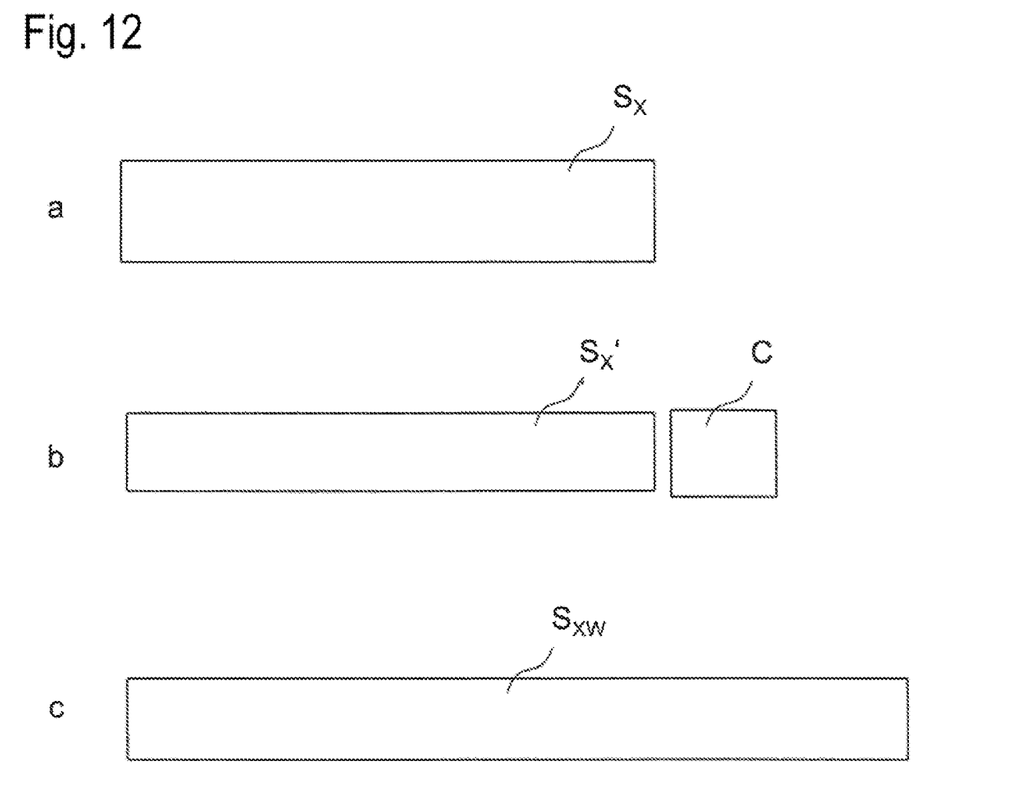

FIG. 12 shows, in the scale-related partial figures a, b, and c and thus, in a manner suitable for size comparison, the respective space requirement
(a) of an unchanged series resonator SX,
(b) of a serial resonator SX' with scaled finger period, reduced aperture, and with additional resonator, and
(c) of an equivalent series resonator SXW with removal weighting.

From the figure, it is clear that the space requirement increases from a) to c), but the solution b) is the one that requires the least additional space.

The invention has been described only with reference to a few embodiments and is therefore not limited to these. A filter according to the invention can therefore deviate from the illustrated structures—that is to say, the block diagram shown. Furthermore, the filter can also differ in its layer structure of the known layer structure shown in FIG. 3.

The filter according to the invention may be part of a duplexer, wherein the invention is used as a receiving filter, but also, in particular, as a TX filter of the duplexer.

The invention claimed is:

1. A SAW filter, comprising:
a series branch connected between a filter input and a filter output, in which series resonators are arranged;
n parallel branches, each including a different parallel resonator, connected to a fixed potential;
an additional resonator, configured to act capacitively at a frequency, connected in parallel to a first series resonator of the series resonators, the first series resonator having a largest finger period of all the series resonators;
wherein a pitch of the additional resonator is configured to have an anti-resonance frequency to form an additional pole at an interference frequency.

2. The SAW filter according to claim 1, wherein the pitch of the additional resonator is lower compared to a pitch of the first series resonator in order to achieve an improved attenuation at the interference frequency;
wherein the interference frequency is higher than a passband of the SAW filter.

3. The SAW filter according to claim 2, wherein:
the first series resonator is configured to have a lowest anti-resonance frequency of all the series resonators;
a pole zero gap of the first series resonator compared to other ones of the series resonators is reduced so far that a parasitic shear mode of an acoustic wave is shifted out of the passband of the SAW filter; and
the other ones of the series resonators have a pole zero gap and a finger period which are higher than in the first series resonator.

4. The SAW filter according to claim 3, wherein:
the pole zero gap of the first series resonator is reduced by the additional resonator; and
the additional resonator is dimensioned such that a parasitic shear mode of the acoustic wave is shifted out of the passband of the SAW filter.

5. The SAW filter according to claim 1, wherein the SAW filter is constructed on a lithium niobate substrate with a cutting angle between red 125 and red 130.

6. The SAW filter according to claim 5, wherein the SAW filter is configured with an $SiO_2$ layer, arranged above an electrode metallization on the substrate.

7. The SAW filter according to claim 1, wherein the anti-resonance frequency of the additional resonator lies outside a passband of the filter.

8. The SAW filter according to claim 1, wherein the SAW filter is designed for operation in a band with a relative bandwidth greater than 3%.

9. The SAW filter according to claim 1, wherein
any of the series resonators whose SH mode is in a range between a right passband edge and a foot of a flank are implemented with a reduced pole zero gap.

10. A method for generating an additional filter pole in a SAW filter,
a) in which, in a first step, the SAW filter is designed from SAW resonators;
b) wherein a series branch, connected between a filter input and a filter output, in which a plurality of series resonators of the SAW resonators are arranged, and n parallel branches connected to a fixed potential, in each of which one parallel resonator of the SAW resonators is arranged;
c) a first series resonator of the plurality of series resonators, the first series resonator having a largest finger period of all the series resonators of the plurality of series resonators, is connected in parallel with an additional resonator acting as a capacitance at a frequency;
d) wherein a pitch of the additional resonator is set at an anti-resonance frequency of the additional resonator that forms the additional filter pole at an interference frequency to be suppressed.

11. The method according to claim 10, wherein:
the SAW filter is configured to have a passband for TX frequencies from 1,850 MHz to 1,910 MHz; and
a frequency position of the additional resonator is set so that a pole at RX frequencies is obtained between 2,110 MHz and 2,155 MHz.

* * * * *